(12) United States Patent
Choi et al.

(10) Patent No.: US 7,461,882 B2
(45) Date of Patent: Dec. 9, 2008

(54) MICROFABRICATED MECHANICALLY ACTUATED MICROTOOL AND METHODS

(75) Inventors: Yoonsu Choi, Atlanta, GA (US); Mark G. Allen, Atlanta, GA (US); James Ross, Decatur, GA (US); Stephen P. DeWeerth, Marietta, GA (US)

(73) Assignee: Georgia Tech Research Corp., Atlanta, GA (US)

( * ) Notice: Subject to any disclaimer, the term of this patent is extended or adjusted under 35 U.S.C. 154(b) by 115 days.

(21) Appl. No.: 11/271,450

(22) Filed: Nov. 11, 2005

(65) Prior Publication Data

US 2006/0181097 A1     Aug. 17, 2006

Related U.S. Application Data

(60) Provisional application No. 60/627,300, filed on Nov. 12, 2004.

(51) Int. Cl.
*B25J 15/12* (2006.01)
*B25J 7/00* (2006.01)

(52) U.S. Cl. .................. 294/100; 294/86.4; 294/902

(58) Field of Classification Search ............. 294/99.1, 294/99.2, 100, 86.4, 902; 901/31, 36, 39; 977/962; 606/206, 207, 210
See application file for complete search history.

(56) References Cited

U.S. PATENT DOCUMENTS

| 4,610,475 | A | * | 9/1986 | Heiserman | 294/86.4 |
|---|---|---|---|---|---|
| 4,898,416 | A | * | 2/1990 | Hubbard et al. | 294/119.1 |
| 5,046,773 | A | * | 9/1991 | Modesitt | 294/100 |
| 5,072,288 | A | | 12/1991 | MacDonald et al. | |
| 5,172,950 | A | * | 12/1992 | Benecke | 294/86.4 |
| 5,275,615 | A | * | 1/1994 | Rose | 606/208 |
| 5,538,305 | A | | 7/1996 | Conway et al. | |
| 5,651,574 | A | * | 7/1997 | Tanikawa et al. | 294/86.4 |
| 5,890,863 | A | * | 4/1999 | Yoneyama | 414/4 |
| 5,895,084 | A | | 4/1999 | Mauro | |
| 6,513,213 | B1 | * | 2/2003 | Muramatsu et al. | 29/25.35 |
| 6,648,389 | B2 | * | 11/2003 | Frey et al. | 294/86.4 |
| 6,669,256 | B2 | * | 12/2003 | Nakayama et al. | 294/99.1 |
| 6,730,076 | B2 | * | 5/2004 | Hickingbotham | 606/16 |
| 7,284,779 | B2 | * | 10/2007 | Muramatsu | 294/100 |
| 2004/0135388 | A1 | * | 7/2004 | Sgobero et al. | 294/100 |

OTHER PUBLICATIONS

Keller, et al., "Microfabricated High Aspect Ratio Silicon Flexures," MEMS Precision Instruments, 1998.
"Hexsil Tweezers for Teleoperated Microassembly," by C. G. Keller and R. T. Howe, IEEE Micro Electro Mechanical Systems Workshop, 1997, pp. 72-77.
Handbook of Industrial Robotics, Shimon Y. Nof, chapter 5, no date.

* cited by examiner

*Primary Examiner*—Dean J Kramer
(74) *Attorney, Agent, or Firm*—Thomas, Kayden, Horstemeyer & Risley, LLP (57) ABSTRACT

Apparatus and processes are disclosed that provide a microfabricated microtool having a mechanically actuated manipulating mechanism. The microtool comprises a tweezer having flexible arms, and an actuating mechanism. A biological, electrical, or mechanical component is grasped, cut, sensed, or measured by the flexible arms. The actuating mechanism requires no electric power and is achieved by the reciprocating motion of a smooth, rigid microstructure applied against the flexible arms of the microtool. In certain implementations, actuator motion is controlled distally by a tethered cable. A process is also disclosed for producing a microtool, and in particular, by micropatterning. Photolithography may be used to form micro-molds that pattern the microtool or components of the microtool. In certain implementations, the tweezer and actuating mechanism are produced fully assembled. In other implementations, the tweezer and actuating mechanism are produced separately and assembled together.

15 Claims, 5 Drawing Sheets

MICROFABRICATED MECHANICALLY ACTUATED MICROTOOL AND METHODS

This application claims the benefit of U.S. Provisional Application No. 60/627,300, filed Nov. 12, 2004.

BACKGROUND

The present invention relates in general to microfabricated devices for grasping, manipulating, and excising microstructures, such as microcomponents or biological structures, and more specifically to microtools having grasping and manipulating mechanisms, such as arms, and mechanical actuator(s) for precisely manipulating the mechanisms for grasping, releasing, rotating, or cutting an object or biological component.

Extraordinary advances are being made in micromechanical device and microelectronic device technologies. Further, advances are being made in MicroElectroMechanical Systems ("MEMS") which comprise integrated micromechanical and microelectronic devices. The term "microcomponent" is generically used herein to encompass microelectronic components, micromechanical components, as well as MEMS components. A need often arises for a suitable mechanism to grasp microcomponents. For example, a need often arises for some type of "gripper" device that is capable of grasping a microcomponent in order to perform pick and place operations with the microcomponent. Pick and place operations may be performed, for example, in assembling/arranging individual microcomponents into larger systems.

With the advances being made in microcomponents, various attempts at developing a suitable gripper mechanism for performing pick-and-place operations have been proposed. This is discussed in the Handbook of Industrial Robotics, by Shimon Y. Nof, chapter 5, for example. Gripper mechanisms that comprise arms that are translatable for grasping a microcomponent using an external, macro-scale translating mechanism have been proposed in the existing art. For example, U.S. Pat. No. 5,538,305 issued to Conway et al. discloses a gripper mechanism that comprises a relatively large mechanism (including a servomotor, drive mechanism, screws, etc.) for controlling the movement of two arms that are coupled thereto. In the Conway et al. patent, each of the arms themselves include a forceps portion that is approximately 7.5 inches (or about 19.05 centimeters) long, which extends from the mechanism that controls movement of the arms. Attached to and extending from the forceps portion of each arm is a replaceable tip that is approximately 1 inch (or about 2.54 centimeters) long. Accordingly, in addition to the relatively large size of the mechanism for controlling movement of the arms, the arms themselves extend from the mechanism a length of over 20 centimeters. Thus, while such gripper device may be utilized for grasping microcomponents, the gripper device is not a micro-scale device, but is instead a relatively large device.

Variations in macro-scale translating mechanisms are presented in U.S. Pat. No. 5,895,084 issued to Mauro. In this approach, precision engineering is required to fasten or screw individual arms of the gripper to a support block. The requirement of the fastener(s), lead screw(s), cam drive(s), and other macro-sized components places substantial limits on the operation of the device and makes this device unsuitable for microfabrication. The structure and size of the Mauro device limits the minimum size of the objects it can manipulate. Furthermore, this complication limits the resolution with which the tweezers can be rotated or three dimensionally positioned. The precision manufacturing techniques required to produce the microgripper are expensive, and this expense, coupled with the complex internal structure, reduces the modularity of the Mauro microgripper. Therefore, it is expensive and difficult to swap out or replace microtools of various shapes and sizes.

Additionally, microgripper devices (e.g., those fabricated using a microfabrication process) have been proposed in the existing art. As described more fully below, microgripper devices have been proposed that comprise grasping mechanisms (e.g., arms) and a microactuator mechanism (e.g., electrothermal actuator or electrostatic actuator) for moving the grasping mechanisms for grasping a microcomponent. Such microactuator mechanisms may be included within the grasping mechanism. For instance, the arms of a microgripper device may comprise electrothermal or electrostatic actuators for generating movement of the arms for grasping a microcomponent. Thus, rather than having the actuation mechanism in an external, macro-scale device as in the gripper disclosed in the Conway et al. patent, microgripper devices have been proposed in the existing art that include, in a micro-scale device, arms and an actuation mechanism for moving the arms (although, the power supply and/or control circuitry for powering the actuation mechanism to generate movement of the arms may be arranged external to the microgripper).

An example of one type of microgripper in the existing art is a microtweezer taught by Keller, et al., in "Microfabricated High Aspect Ratio Silicon Flexures," MEMS Precision Instruments, 1998; and "Hexsil Tweezers for Teleoperated Microassembly," by C. G. Keller and R. T. Howe, IEEE Micro Electro Mechanical Systems Workshop, 1997, pp. 72-77. The microtweezers proposed in Hexsil Tweezers for Teleoperated Microassembly has two parallel arms that are operable, through electrothermal actuation, to move toward or away from each other, which may enable the arms to grasp a microcomponent between them. More specifically, each arm is positionally fixed at one end and is movable at the opposing end (which may be referred to as the arm's "released end"). Each arm effectively comprises an electrothermal actuator (or thermal expansion actuator beam) that is operable, responsive to electric power being applied thereto, to cause the released end of the arm to move in a direction away from the opposing arm. Therefore, electric power may be applied to the microtweezer device to cause the released ends of the tweezer arms to spread apart.

In the above-described microtweezer device, applying greater power to the electrothermal actuators causes the arms to spread further apart, while reducing the amount of applied power causes the arms to return toward each other. Accordingly, to maintain a given position of the arms (other than their powered-off position) or to maintain a particular gripping force against an object being grasped (other than the force applied when the device is powered-off), power must be maintained to the arms.

U.S. Pat. No. 5,072,288 issued to MacDonald et al. provides another example of a microgripper proposed in the existing art. The microgripper disclosed in the MacDonald et al. patent has two parallel arms that are operable, through electrostatic actuation, to move toward or away from each other, which may enable the arms to grasp a microcomponent between them. Each arm is positionally fixed at one end and is movable at an opposing end (referred to as the arm's "released end"). Each arm comprises an electrically-conductive beam (e.g., having metal lines) that is operable, responsive to electric power being applied thereto, to cause the released end of the arm to move in a direction away from the opposing arm or in a direction toward the opposing arm. Therefore, electric power may be applied to the microgripper device to cause the released ends of its arms to spread apart or to compress together to achieve a tweezing action.

The microgripper device disclosed in the MacDonald et al. patent uses electrostatic forces between the arms to generate the tweezing action. Application of a step function potential difference between the arms (by applying potentials to the electrically-conductive beam forming each arm) may generate either an attracting or repelling electrostatic force between the charged arms, depending on the polarity of the potential. Accordingly, to maintain a given position of the arms (other than their powered-off position) or to maintain a particular gripping force against an object being grasped (other than the force applied when the device is powered-off), power must be maintained to the arms.

With microgrippers of the existing art, such as those proposed in Hexsil Tweezers for Teleoperated Microassembly and in the MacDonald et al. patent, the range of motion of the microgripper arms is relative to their length. That is, the longer the arms, the greater the range of motion that may be achieved through the above-described electrothermal or electrostatic actuation of the arms. For instance, the microtweezers proposed in Hexsil Tweezers for Teleoperated Microassembly have arms that are 8 millimeters (mm) in length by 1.5 mm wide by 45 micrometers (μm) thick. The released ends of the arms are able to be displaced through electrothermal actuation to allow for a separation distance of 35 μm. To achieve greater separation, the arms may be implemented having a greater length. In general, the range of motion associated with an electrothermal actuator is limited to approximately 0.5 to approximately 10 percent of the overall length of the actuator's arms. However, in general, increasing the length of the arms decreases their rigidity (particularly if their thickness is not also increased), which may in turn decrease their gripping force.

Microgrippers requiring power may experience dynamic fluctuations in the conductivity of the device. Additionally, these devices may produce stray electrostatic fields that can influence the object one is trying to manipulate.

It would be desirable to have gripping devices, methods of manufacture, and gripping processes that improve upon the above-described devices and processing techniques and that does not require the use of electrical power for operation.

BRIEF DESCRIPTION OF THE DRAWINGS

The various features and advantages of the present invention may be more readily understood with reference to the following detailed description taken in conjunction with the accompanying drawings, wherein like reference numerals designate like structural elements, and in which.

DETAILED DESCRIPTION

Figure 1A:
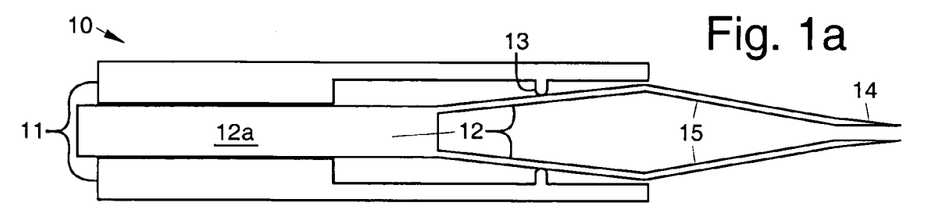
FIGS. 1a and 1c illustrate top views of exemplary embodiments of a microfabricated tool for grasping, manipulating, and excising microstructures.
Figure 1B:
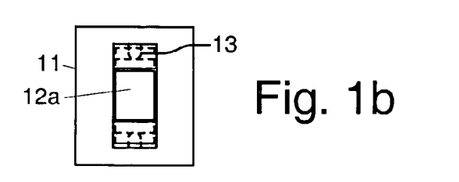
FIG. 1b illustrates an end view of the microfabricated microtool.
Figure 1C:
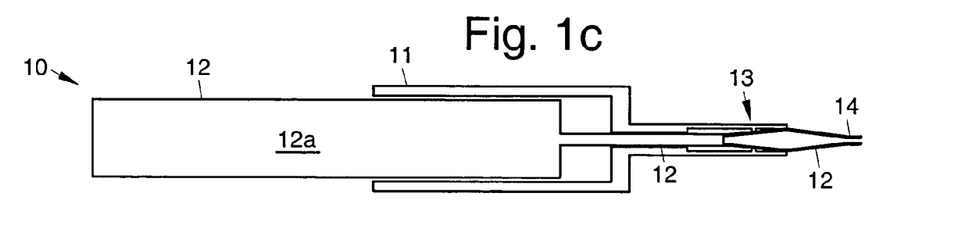

Referring to the drawing figures, FIGS. 1a and 1c illustrate an exemplary embodiment of a microfabricated tool 10, or microtool 10, for grasping, manipulating, and excising microstructures. FIGS. 1a and 1c illustrate top views of reduced-to-practice embodiments of the microtools 10, which include an actuating mechanism 11 comprising a tweezer box 11, and a tweezer 12. FIG. 1b illustrates an end view of the microtool 10.

As used herein, the term "microfabricated" refers to a component or portion of a component that is fabricated in part using lithographic techniques or processes. This involves using photolithography to pattern a desired structure. In general, the size of the structure is only limited by the optical resolution that can be achieved by the photolithographic process. As used herein, the term "microtool" refers to a device or structure that is "unified" or "single-bodied" (i.e., not assembled from multiple components), and in general relates to any movable microfabricated component.

The actuating mechanism 11 or tweezer box 11 comprises two separated stepped rectangular structures that are separated by a gap in which the tweezer 12 is disposed. The tweezer box 11 steps laterally away from the tweezer 12 and has a contact member 13, such as a dimple 13, formed on each lateral inner surface. The tweezer 12 comprises a rectangular body 12a, or tweezer grip 12a, that is disposed between the separated stepped rectangular structures of the tweezer box 11. A working end of the tweezer 12 comprises two outwardly bowed flexible microarms 15 that extend from the tweezer grip 12a that terminate at distal ends to form a tip 14. Alternatively, the tweezer 12 may comprise at least one flexible microarm 15 and at least one fixed microarm 15. There is a gap between the microarms 15 at the tip 14. The dimples 13 of the tweezer box 11 contact lateral surfaces of the outwardly bowed flexible microarms 15.

The fully-mechanical microtools 10 thus comprise two parts: the tweezer 12 and tweezer box 11. The tweezer box 11 encloses the proximal half of the tweezer 12 and moves laterally along the tweezer 12 to regulate the opening and closing of the tip 14. In operation, the tweezer box 11 is movable along the tweezer grip 12a of the tweezer 12, and the dimples 13 slide along the adjacent surfaces of the outwardly bowed flexible microarms 15 to open and close the tip 14 in response.

Figure 2:
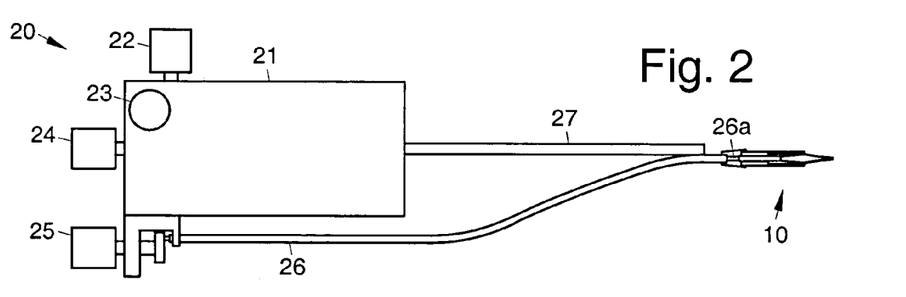
FIG. 2 illustrates the principle of operation of the tool.

FIG. 2 illustrates operation of the microtools 10 shown in FIGS. 1a and 1b. A microprobe station 20 comprises a micromanipulator 21 that houses x, y, and z axis control knobs 22, 23, 24 that control the x, y, and z positions of the tweezer tip 14. The micromanipulator 21 has a shaft 27 extending therefrom to which the microtool 10 is attached. A tethered cable release 26 having a slidable inner cable 26a is secured to the micromanipulator 21 and shaft 27. The slidable inner cable 26a is coupled to the tweezer box 11, for example, to control its movement.

A tip control knob 25 precisely regulates opening and closing of flexible microarms 15 by way of the tethered cable release 26 and slidable inner cable 26a. A fifth knob may be added to allow for axial rotation of the tweezer tip 14, if desired. The fifth knob comprises control apparatus for rotating the microtool 10 around an axis through the microtool. For example, simple axial rotation may be achieved by creating a mechanism to rotate the micromanipulator shaft 27, thus rotating the microtool 10. More complicated systems may be put in place to rotate that tweezer box 11 independently of the shaft 27 that it is tethered to.

The microtool 10 is fastened into place on the micromanipulator shaft 27 where one would normally secure a probe needle and sharp electrodes. The axis knobs 22, 23, 24 control the x, y, and z location of the microtool 10. The tethered cable release 26 connects the tip control knob 25 to the tweezer box 11. The opening and closing of the tweezer tip 14 is then precisely controlled by the movement of the tweezer box 11 by way of the tethered cable release 26 and the tip control knob 25. The tip control knob 25 may be custom fit to the body of the microprobe station 20, or an optic field or other rotary knob may be used, which is commercially available on some systems.

Coaxial Line Feed and "Socketing"

For an end-user or consumer, it is important that the microtool 10 be easily connected to and disconnected from the shaft 27 of the micromanipulator 21. Furthermore, it is important that the driving mechanism for the tweezer box 11 does not induce any unwanted motion or stress in the microtool 10. The driving mechanism should be able to be easily and securely fastened (as opposed to permanently anchored) to the tweezer box 11. An exemplary way to insure these desired characteristics is disclosed below.

In an exemplary embodiment of the microtool 10, such as is shown in FIG. 1 or 2, opening and closing of the tweezer tip 14 is regulated by moving the tweezer box 11 with respect to a fixed tweezer 12. It is also possible to achieve controlled, precise motion of the tweezer tip 14 by performing the opposite task, namely, moving the tweezer 12 with respect to a fixed tweezer box 11. In either case, the tweezer box 11 or the tweezer 12 must be fastened to either the micromanipulator shaft 27 (to be fixed in place) or the driving mechanism (to allow movement). There are, in fact, dozens of ways to create secure and temporary connections. Among them are sockets, hooks and hoops, and screw pin fasteners, for example. One novel way to achieve a secure and reliable connection is to take advantage of the material properties of the tweezer box 11. The microtool 10 may be constructed from electroplated Ni—Fe, so that magnetic attraction may provide a means of attachment.

In currently reduced-to-practice embodiments of the microtool 10, the motion of the tweezer box 11 is achieved by rotating the tip control knob 25, which translates this action into lateral motion of the tethered cable release 26. As an alternative to this approach, one could run the cable 26a or driving mechanism through the center of a hollow shaft that it is fixed to the micromanipulator 27. This approach, referred to a coaxial line feed, is illustrated in FIG. 3.

Figure 3:
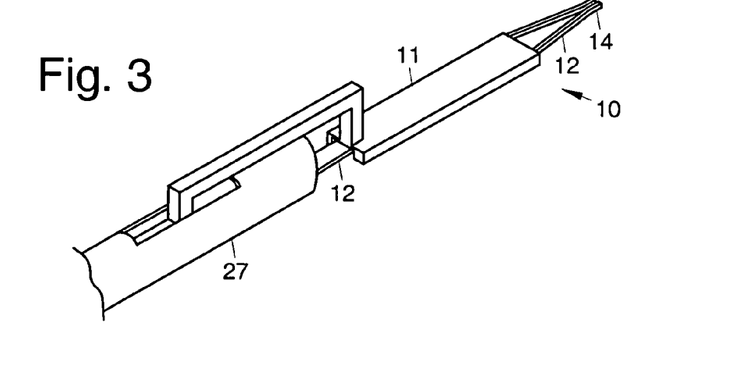
FIG. 3 illustrates an exemplary driving mechanism for the tool.

As is shown in FIG. 3, the driving mechanism (i.e., cable 26a) is run through the center of the shaft 27 of the micromanipulator 21. In this case, the tweezer box 11 is securely fastened to the shaft 27, and the fastened tweezer box 11 is allowed to move laterally to regulate the opening and closing of the tip 14. The opposite action may also be performed, where the tweezer box 11 is fixed and the tweezer 12 is allowed to move.

Microtool Styles

The microtool tip 14 may have any desired two dimensional form, so that the microtool 10 can be easily modified to accommodate various objects or tasks. Some examples of these modifications are shown in FIGS. 4a-4c.

Figure 4A:
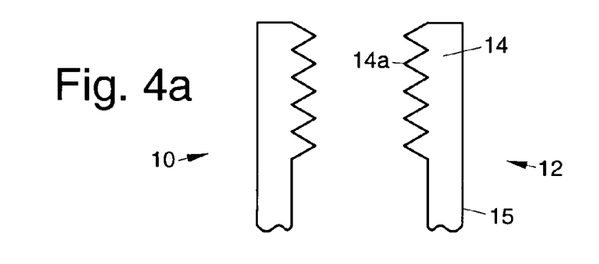
FIGS. 4a-4c illustrate different tip profiles for the tool.
Figure 4B:
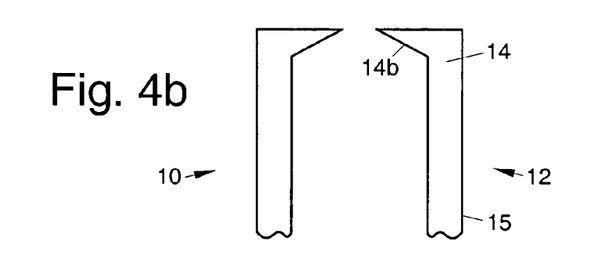
Figure 4C:
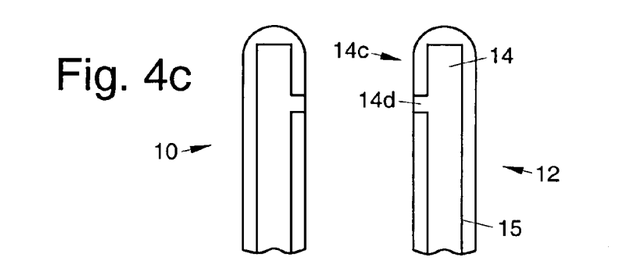

FIG. 4a shows a microtool 10 with a serrated tip 14a. FIG. 4b shows a microtool 10 formed from symmetrically opposing sharp microtips 14b. FIG. 4c shows an insulated microtool 10 with insulated conductive microtips 14c or traces and isolated recording microelectrodes 14d that may be used for electrophysiological measurements.

Figure 5:
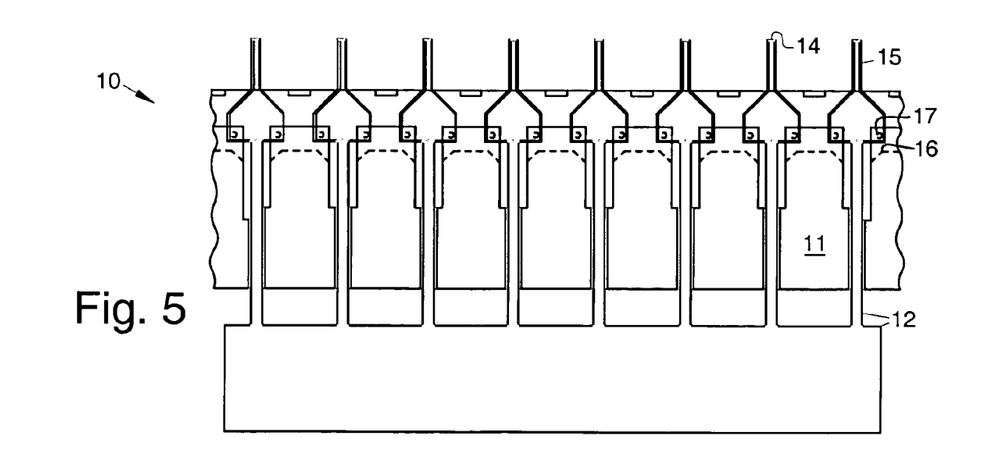
FIG. 5 illustrates an exemplary multi-tool microstructure.

FIG. 5 illustrates an exemplary multi-microtool 10. As is shown in FIG. 5, parallel microactuation is achieved by interconnecting multiple individual microtools 11 so that multiple tweezers 12 are arranged parallel to each other. In this particular embodiment, forward motion of the tweezer box 11 with respect to the tweezer tip 14 causes a component 16 to press the tweezer tips 14 together. Backward motion of the tweezer box 11 causes pins 17 to open the tweezer tip 14. There exists some slack, or space, between the mechanisms 16, 17 that cause opening and closing.

Fabrication Processes

The microtools 10 may be fabricated using at least two different processes. In a first process or method, the tweezer 12 and tweezer box 11 are patterned together. This process has the advantage that the actuator mechanism is virtually unlimited in its geometry. For example, the dimples 15 may be on the inside of the microtool 10, and no assembly is required to complete the microtool 10. However, this process requires more layers and more substrate surface area. In a second process or method, the tweezer 12 and tweezer box 11 are each built up separately in a single layer and then assembled.

Figure 6A:
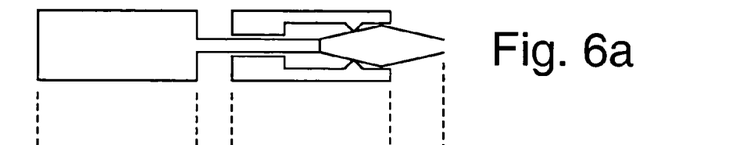
FIGS. 6a-6g illustrate exemplary processing steps performed to fabricate an exemplary tool.
Figure 6B:
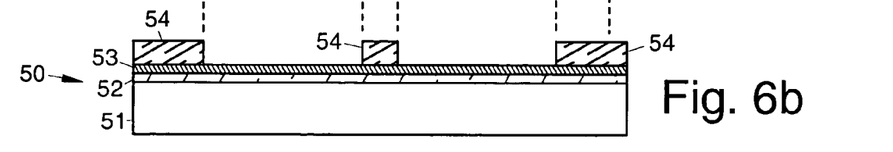

In the first method, fabrication of the microtool 10 employs four masks, and uses conventional surface micromachining technology. FIGS. 6b-6g illustrate an exemplary fabrication sequence and will be discussed in detail below. FIG. 6a illustrates a top view of the fabricated microtool 10 that is produced by the fabrication sequence shown in FIGS. 6b-6g. Various components of the microtool 10 are fabricated by repeatedly defining and filling micromolds. These molds can be filled by an number of techniques known in the art, including doctor-blading, injection, or casting. Preferably, the mold is filled using electrodeposition. While the electroplating molds easily separate components horizontally, sacrificial layers are used to separate components vertically. Together, the horizontal and vertical separation of components creates a freedom of movement that allows individual mechanisms to interact to perform the desired function. In total, three electroplating operations are performed. In the first operation, the base of the tweezer grip 12a and tweezer box 11 are formed. The second operation continues to build up the tweezer grip 12a while forming the side walls of the tweezer box 11 and tweezer tip 12. The final electroplating operation completes the tweezer grip 12a and forms the top of the tweezer box 11. Two sacrificial layers 56, 61 separate the tweezer tip 12 from the top and bottom of the tweezer box 11, and an additional sacrificial layer 52 separates the tweezer 10 from the substrate.

Figure 6C:
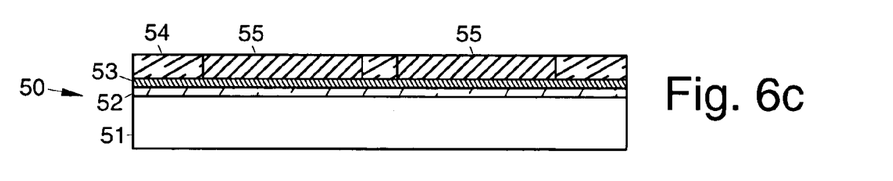
Figure 6D:
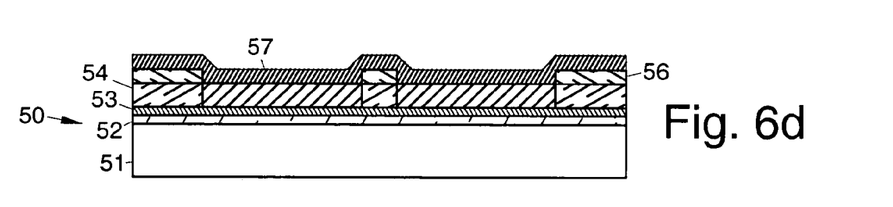
Figure 6E:
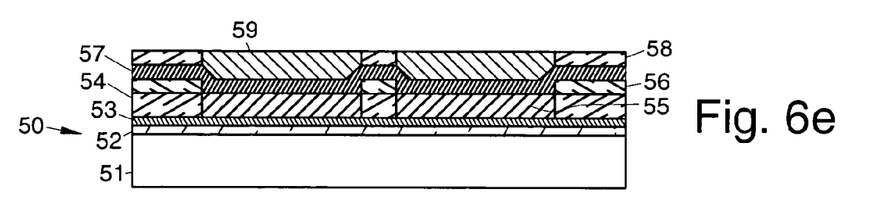
Figure 6F:
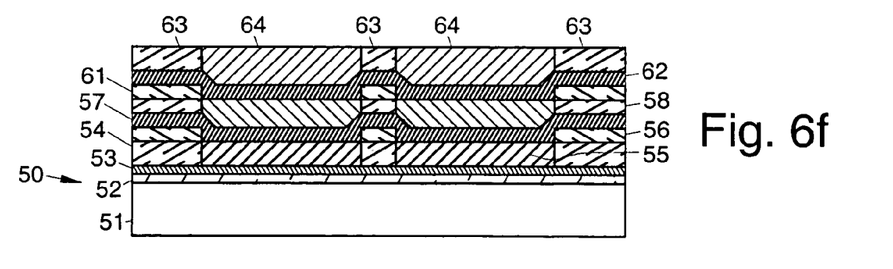
Figure 6G:
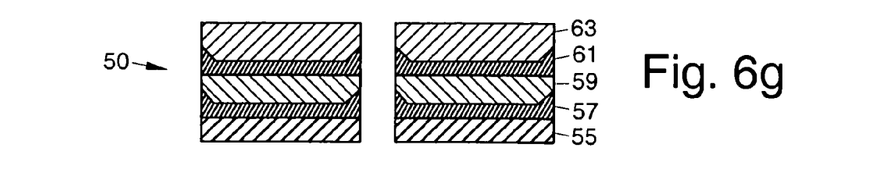

Referring to FIGS. 6b-6g, first, an SiO2 sacrificial layer 52 is deposited by PECVD onto a substrate 51. Exemplary substrates 51 include silicon or glass. A copper plating base 53 is then deposited onto the sacrificial layer 52 using a DC sputterer. Next, AZ4620 photoresist 54 is deposited and patterned to form an electroplating mold. As is shown in FIG. 6c, nickel-iron (Ni—Fe) 55 is then electroplated, forming the bottom portion of the tweezer grip 12a and tweezer box 11. Next, as is shown in FIG. 6d, Shipley 1827 photoresist 56 is prepared as a sacrificial layer that facilitates separation of the tweezer tips 14 from the tweezer box 11 after fabrication. A copper seed layer 57 is applied, and as is shown in FIG. 6e, nickel-iron 59 is electroplated in AZ 4620 photoresist molds 58 formed on the seed layer 57 to form the tweezer tip 14, side walls of the tweezer box 11, and tweezer grip 12a. Shipley 1827 photoresist 61 is patterned, once again, to form the sacrificial layer that vertically separates the tweezer tip 12 from the top of the tweezer box 11. A copper seed layer 62 is deposited, and a final layer of AZ4620 photoresist 63 is patterned to define the electroplating mold for the tweezer grip 12a and the top of the tweezer box 11. Next, the mold is filled with electroplated nickel-iron 64. Finally to release the tweezer 10, the different sacrificial layers comprising photoresist 54, 56 copper 53, 57, 62 and SiO2 52, are removed with acetone, copper etchant and buffered oxide etchant (BOE), respectively, thus producing the tweezer 12.

Figure 7A:
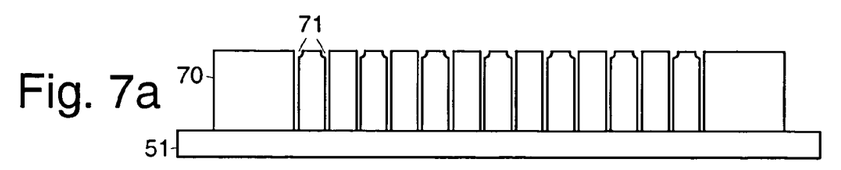
FIGS. 7a and 7b illustrate fabrication of multiple tweezer-boxes using a single step micro-molding process.
Figure 7B:
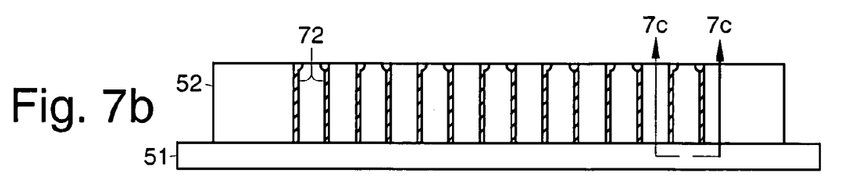
Figure 7C:
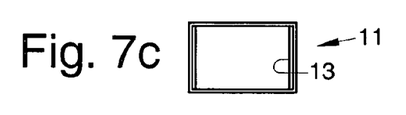
FIG. 7c is a bottom end view of a fabricated tweezer box produced using the single step micro-molding process taken along the lines 7c-7c in FIG. 7b.

The second method separately produces the tweezer-box 11 and tweezer 12 in a single step. In this process the tweezers 12 and tweezer box 11 are each produced separately using a single step micro-molding process, allowing for massive increases in scale with corresponding decreases in manufacturing time and materials. FIGS. 7a and 7b illustrate fabrication of the tweezer box 11. As is shown in FIG. 7a, a vertical micro-mold 70 is formed on a substrate 51. As is shown in FIG. 7b, copper 72 is deposited in voids 71 of the micro-mold 70 to form the tweezer box 11. In this approach, the tweezer boxes 11 are formed in a vertical direction. One advantage to this approach is that the tweezers 12 may be built using significantly fewer processing steps. Additionally, this process increases volume while decreasing production costs. FIG. 7c is a bottom end view of a fabricated tweezer box 11 produced using the single step micro-molding process shown in FIGS. 7a and 7b, taken along the lines 7c-7c in FIG. 7b. The outer and next-adjacent lines of the tweezer box 11 shown in FIG. 7c correspond to side walls of the tweezer box 11, while the inner line defines the inner edge of the dimples 13.

Figure 8:
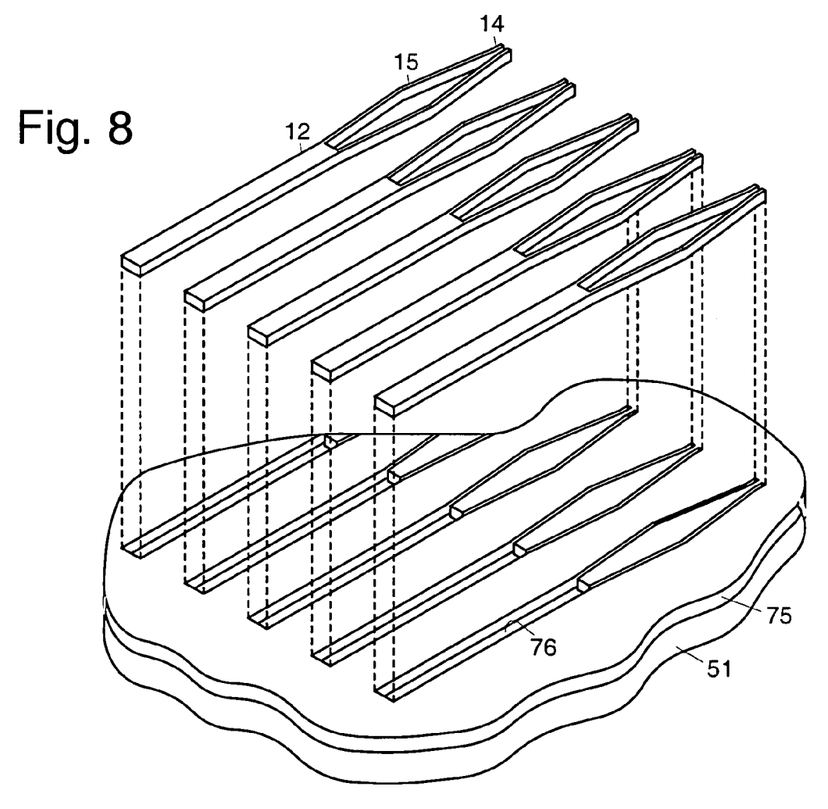
FIG. 8 is an enlarged exploded view that illustrates fabrication of a tweezer body using a single step micro-molding process.

FIG. 8 is an enlarged exploded view that illustrates fabrication of the tweezers 12. A horizontal micro-mold 75 is fabricated on a substrate 51 having voids corresponding to the tweezers 12 illustrated in FIG. 8. Copper is deposited in voids 76 of the micro-mold 77 to form the tweezers 12. The tweezers 12 may be made from plastics or electroplated metals. PDMS (poly(dimethylsiloxane)) or other materials may be used to define a micro-mold 75 for plastics. For photolithography, SU-8 or other photoresist materials may be used to define an electroplating micro-mold 52 for metals such as Ni—Fe.

The microtool 10 may be employed in many different fields, including biology and MEMS/electronics. The manufacturing process and general principles of operation lends itself to producing microtools 10 with various geometries, functions, and materials. Therefore, it is possible to customize a microtool 10 to fit a particular task or application. For example, it is possible to produce biological micrograbber and microlesioning tools that are sterile and disposable. Furthermore, it is possible to pattern and insulate conductive traces on the tweezers 13 that open up at microelectrodes for the purpose of electrophysiological recording. The microtool 10 may also be customized for electronic applications, the electrical and mechanical properties of the microtool 10 may be readily controlled.

Dimensions

Reduced-to-practice embodiments of the microtools have been fabricated with the following dimensions. In one embodiment shown in FIG. 1a, the tweezer box 11 has a length of 2.35 mm, and a width of 0.437 mm. The length of the arms on which the dimples 15 are formed is 1.343 mm. The dimples 15 are located about 0.4 mm from the end of the tweezer box 11 adjacent to the tip 13. The dimples 15 have a diameter of 0.057 mm. The tweezer 12 has a thickness of 0.15 mm at its back portion distal from the tip 13. The gap at the end of the tip 13 is 0.04 mm, the thickness of the microarms 15 at the end of tip 14 is 0.01 mm and the tip 14 has a width of 0.02 mm. The tip 14 is angled at 4 degrees.

In another embodiment, the tweezer box 11 has a length of 1.1 mm, and a width of 0.2 mm where it surrounds the tweezer 13. The dimples are located about 0.2 mm from the end of the tweezer box 11 adjacent to the tip 14. The dimples 15 have a diameter of 0.029 mm. The tweezer box 11 is stepped outward to 0.8 mm and has an extended length of 1.7 mm. The tweezer 12 has a thickness of 1.075 mm at its back portion distal from the tip 13. The gap at the end of the tip 14 is 0.02 mm, the thickness of the microarms 15 at the end of tip 14 is 0.01 mm, and the tip 14 has a width of 0.01 mm. The tip 14 is angled at 4 degrees.

Alternative Microtools Using Similar Means of Microactuation

Figure 9A:
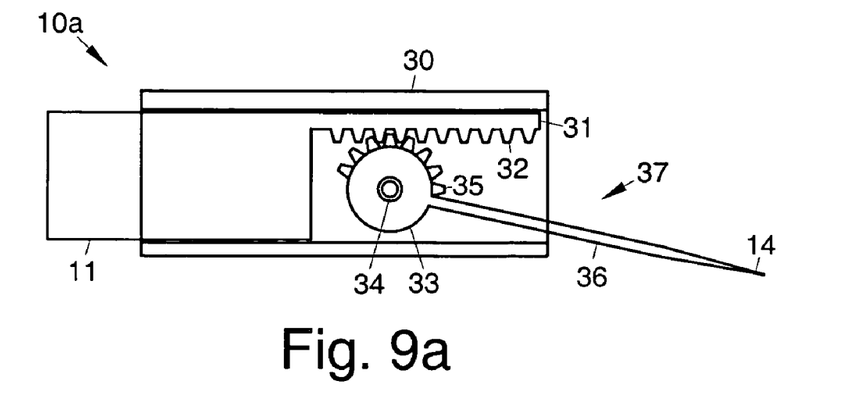
FIGS. 9a-9c illustrate an alternative implementation of the tool that allows microlesioning or microcutting.
Figure 9B:
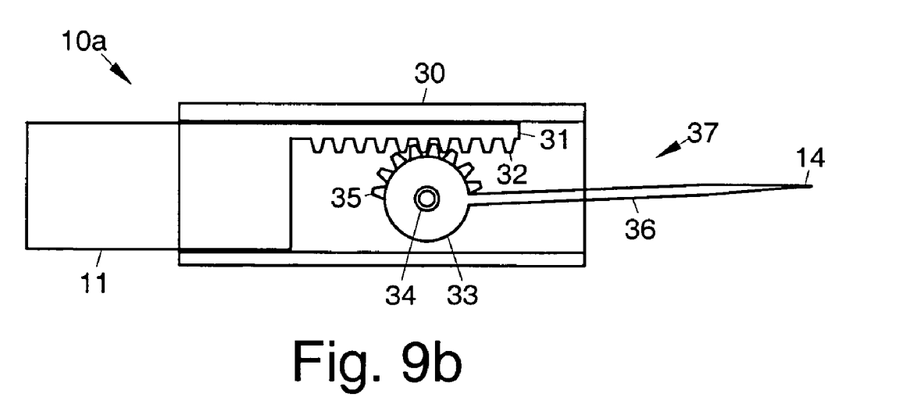
Figure 9C:
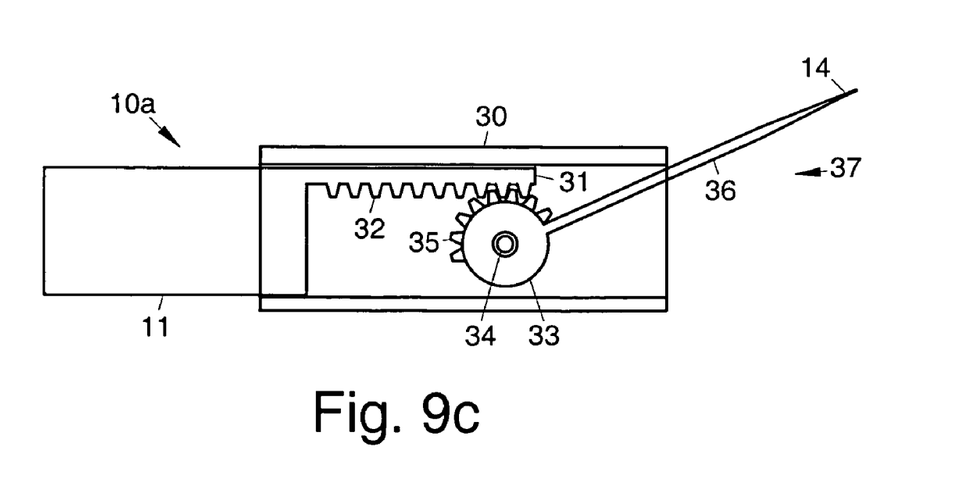

It is possible to use the 'tweezer box' style of actuation to perform entirely different actions other than those produced by flexing microarms 15. FIGS. 9a-9c illustrate a microlesioning tool 10a that can be produced using the processes discussed above and that is actuated using the same external means (microprobe station 20 or micromanipulator 21) as the microtools 10 described above. This microtool 10 may be used in tandem with the more traditional microtools 10 described above.

More particularly, FIGS. 9a-9c illustrate an alternative implementation of the microtool 10a that allows rotation of a cutting device 37. The tweezer box 11 is generally rectangular and slides within inner sidewalls of an outer housing 30. The housing 30 comprises a shaft 34. A lateral portion 31 of the tweezer box 11 extends along one of an inner wall of the housing 30 and has gear teeth 32 formed along its inner edge.

The cutting device 37 comprises a circular hub 33 having gear teeth 35 formed around a portion of its periphery. The hub 33 is rotatable around the shaft 34. The cutting device 37 is positioned so that the gear teeth 32, 35 of the tweezer box 11 and cutting device 37 mesh. The cutting device 37 has an arm 36 extending from the hub 33. The arm 36 tapers at the distal end to form a tip 14 configured as a cutting edge.

Lateral movement of the tweezer box 11 within the housing 30 causes corresponding rotation of the hub 33 via the meshed gear teeth 32, 35 resulting in rotational movement of the cutting device 37. FIGS. 9a-9c illustrate three exemplary rotational positions of the cutting device 37 resulting from movement of the tweezer box 11 within the housing 30.

Thus, processes for manipulating components, microtools 10 for implementing the process, and processes for manufacturing the microtools 10 or at least parts of them have been disclosed. The disclosed embodiments have advantages over the prior art in that they make possible the simple, precise, fully mechanical and cost-effective micromechanical manufacture of microtools 10 for precise manipulation, positioning, measuring, and sensing of biological, electrical, and mechanical components having typical dimensions from the sub-micrometer range to the lower millimeter range.

The microtools 10 or individual microtool parts may be produced using conventional micromachining technologies, and in particular, the microtools 10 may be constructed using electroplating and micro-molding techniques. Different exemplary processes may be used to manufacture the microtools 10. In a first exemplary process, the microtool 10 is built up in three separate layers that produce a fully assembled microtool 10 and mechanical actuating structure. In a second exemplary process, the microtool 10 and actuating structures are built up independently in a single layer and assembled together. Using either process, the microtool 10 can be easily modified to accommodate various objects or tasks.

Variations in the function, size, and style of the microtool 10 may be achieved using the disclosed processes. For example, the microtool 10 may be modified to perform electrophysiological recording measurements. In a particular embodiment, microelectrodes 12b are patterned and electrically isolated on the tip 14 of the microtool 10. Further, the microtool 10 may be modified to produce microcutting or microlesioning tools. In a particular embodiment, the tip 14 of the microtool 10 is sculpted to have sharp symmetrically opposing edges.

The microfabricated mechanically actuated mechanism of the microtool 10 requires no power and provides delicate and precise control over the position of its flexible arms 15. The fully mechanical actuating mechanism for tip closure is achieved by the reciprocating motion of a smooth, rigid microstructure (tweezer box 11) applied against the flexible arms 15 of the microtool 10. The tip 14 of the microtool 10 may be angled, so that the translation of lateral motion of the actuator to the motion of the microtool arms 15 is significantly reduced. In a reduced-to-practice embodiment, 100 μm of lateral motion translates into 10 μm of tip closure. This allows for submicron resolution of the motion of the microtool arms 15 for a large range of microtool sizes.

Thus, microfabricated mechanically actuated microtools and methods have been disclosed. It is to be understood that the above-described embodiments are merely illustrative of some of the many specific embodiments that represent applications of the principles discussed above. Clearly, numerous and other arrangements can be readily devised by those skilled in the art without departing from the scope of the invention.

What is claimed is:

1. An apparatus comprising:
   a microfabricated single-bodied microtool comprising a microfabricated body and two mechanically moveable microfabricated microarms that extend from the body and terminate at a distal end to form a tip;
   a microfabricated mechanical single-bodied actuating mechanism that contacts the microtool and is operative to mechanically cause motion of the microtool, wherein the microfabricated body is disposed in a channel of the actuating mechanism, wherein a portion of the channel contacts the microfabricated body, wherein the microfabricated body is a guide for the actuating mechanism as the actuating mechanism moves forward and backward, wherein the microfabricated mechanical as the actuating mechanism comprises a pair of opposing contact members that contact lateral surfaces of the two mechanically moveable microfabricated microarms and are operative to mechanically open and close lateral portions of the tip formed by the two mechanically moveable microfabricated microarms, wherein mechanically opening and closing the microfabricated microarms are caused by relative motion between the contact members and the mechanically moveable microfabricated microarms as the microfabricated body moves forward or backward in the channel; and
   a micromanipulator having a shaft and control apparatus for mechanically controlling movement of the shaft of the micromanipulator, wherein the microfabricated microtool or microfabricated mechanical actuating mechanism is coupled to the shaft of the micromanipulator, wherein the micromanipulator comprises a control member for mechanically moving the microfabricated mechanical actuating mechanism relative to the microtool to open and close the tip of the microtool.

2. The apparatus recited in claim 1 wherein the tip of the microtool comprises substantially flat opposed surfaces.

3. The apparatus recited in claim 1 wherein the tip of the microtool comprises serrated opposed surfaces.

4. The apparatus recited in claim 1 wherein the tip of the microtool comprises sharp opposed surfaces.

5. The apparatus recited in claim 1 wherein the tip of the microtool comprises substantially insulated conducting surfaces with isolated conducting microelectrodes.

6. The apparatus recited in claim 1 further comprising control apparatus for rotating the microtool around an axis through the microtool.

7. The apparatus recited in claim 1 wherein the microtool is connected to a socket formed in the actuating mechanism.

8. The apparatus recited in claim 1 wherein the microtool comprises magnetic material and is magnetically secured in a socket formed in the actuating mechanism.

9. An apparatus comprising:
   a microfabricated single-bodied microtool comprising a microfabricated body and two mechanically moveable microfabricated microarms that extend from the body and terminate at a distal end to form a tip;
   a microfabricated mechanical single-bodied actuating mechanism that contacts the microtool and is operative to mechanically cause motion of the microtool, wherein the microfabricated mechanical actuating mechanism comprises a pair of opposing contact members disposed on an inside surface to the actuating mechanism that contact lateral surfaces of the two mechanically moveable microfabricated microarms and are operative to mechanically open and close lateral portions of the tip formed by the at least two mechanically moveable microfabricated microarms, wherein the contact members and the mechanically moveable microfabricated microarms are in a plane that passes through the contact members and the mechanically moveable microfabricated microarms, wherein mechanically opening and closing of the tip of the mechanically moveable microfabricated microarms are caused by relative motion between the contact members and the mechanically moveable microfabricated microarms; and
   a micromanipulator having a shaft and control apparatus for mechanically controlling movement of the shaft of the micromanipulator, wherein the microfabricated microtool or microfabricated mechanical actuating mechanism is coupled to the shaft of the micromanipulator, wherein the micromanipulator comprises a control member for mechanically moving the microfabricated mechanical actuating mechanism relative to the microtool to open and close the tip of the microtool.

10. The apparatus recited in claim 9 wherein the tip of the microtool comprises surfaces selected from: substantially flat opposed surfaces, serrated opposed surfaces, and sharp opposed surfaces.

11. The apparatus recited in claim 9 wherein the tip of the microtool comprises substantially insulated conducting surfaces with isolated conducting microelectrodes.

12. The apparatus recited in claim 9 further comprising control apparatus for rotating the microtool around an axis through the microtool.

13. The apparatus recited in claim 9 wherein the microtool is connected to a socket formed in the actuating mechanism.

14. The apparatus recited in claim 9 wherein the microtool comprises magnetic material and is magnetically secured in a socket formed in the actuating mechanism.

15. An apparatus comprising:
a microfabricated single-bodied microtool comprising a microfabricated body and at least two mechanically moveable microfabricated microarms that extend from the body and terminate at a distal end to form a tip;
a microfabricated mechanical actuating mechanism that contacts the microtool and is operative to mechanically cause motion of the microtool, wherein the microfabricated mechanical actuating mechanism comprises a plurality of contact members that contact lateral surfaces of the at least two mechanically moveable microfabricated microarms and are operative to mechanically open and close lateral positions of the tip formed by the at least two mechanically moveable microfabricated microarms, wherein mechanically opening and closing are caused by relative motion between the contact members and the mechanically moveable microfabricated microarms;
a micromanipulator having a shaft and control apparatus for mechanically controlling movement of the shaft of the micromanipulator, wherein the microfabricated microtool or microfabricated mechanical actuating mechanism is coupled to the shaft of the micromanipulator, wherein the micromanipulator comprises a control member for mechanically moving the microfabricated mechanical actuating mechanism relative to the microtool to open and close the tip of the microtool; and
control apparatus for rotating the microtool around an axis through the microtool.

* * * * *

UNITED STATES PATENT AND TRADEMARK OFFICE
CERTIFICATE OF CORRECTION

| | | |
|---|---|---|
| PATENT NO. | : 7,461,882 B2 | Page 1 of 1 |
| APPLICATION NO. | : 11/271450 | |
| DATED | : December 9, 2008 | |
| INVENTOR(S) | : Choi et al. | |

It is certified that error appears in the above-identified patent and that said Letters Patent is hereby corrected as shown below:

Column 1, line 6, insert

--STATEMENT REGARDING FEDERALLY SPONSORED RESEACH OR DEVELOPMENT

This invention was made with U.S. Government support under Agreement No. 1 R01 EB00786-01, awarded by the National Institutes of Health. The Government has certain rights in this invention.--

Signed and Sealed this

Fourth Day of August, 2009

JOHN DOLL
*Acting Director of the United States Patent and Trademark Office*